United States Patent [19]

Nakao

[11] Patent Number: 5,366,913
[45] Date of Patent: Nov. 22, 1994

[54] METHOD OF MANUFACTURING SEMICONDUCTOR DEVICE EMPLOYING OXIDE SIDEWALLS

[75] Inventor: Hironobu Nakao, Kyoto, Japan

[73] Assignee: Rohm Co., Ltd., Kyoto, Japan

[21] Appl. No.: 962,323

[22] Filed: Oct. 15, 1992

[30] Foreign Application Priority Data

Oct. 25, 1991 [JP] Japan .................................. 3-279070

[51] Int. Cl.⁵ .................................................. H01L 21/336
[52] U.S. Cl. .................................... 437/41; 437/44; 437/48; 437/52; 437/228; 437/229; 437/984; 148/DIG. 111
[58] Field of Search ............... 437/41, 44, 50, 52, 437/984, 229, 40, 48, 228; 257/202, 204; 148/DIG. 111

[56] References Cited

U.S. PATENT DOCUMENTS

| | | | |
|---|---|---|---|
| 4,792,534 | 12/1988 | Tsuji et al. | 437/229 |
| 5,017,515 | 5/1991 | Gill | 437/229 |
| 5,094,971 | 3/1992 | Kanebako | 437/52 |
| 5,114,872 | 5/1992 | Roselle et al. | 437/48 |

FOREIGN PATENT DOCUMENTS 1-257352  10/1989  Japan .................................. 437/947

*Primary Examiner*—T. N. Quach
*Attorney, Agent, or Firm*—Brumbaugh, Graves, Donohue & Raymond

[57] ABSTRACT

When a semiconductor is manufactured by a resist mask process while using photolithography techniques, the gate wiring width is increased without increasing the cell area by providing a sidewall on the gate mask and using the sidewall as a mask. The sidewall is produced by applying a CVD oxide film to the mask and removing the oxide film by anisotropic etching. This provides a minimum gate line width of $0.7\mu$ and a minimum space width of $0.3\mu$.

2 Claims, 3 Drawing Sheets

METHOD OF MANUFACTURING SEMICONDUCTOR DEVICE EMPLOYING OXIDE SIDEWALLS

BACKGROUND OF THE INVENTION

The present invention relates to a method of manufacturing a semiconductor device with an NAND structure such as an FET or a non-volatile memory, etc.

As an FET or a non-volatile memory with an NAND structure, the FET, etc., providing a number of CGs and SGs between an Si substrate 1 and a thin film of BL, etc., as shown in FIG. 1 and connected to the circuits as shown in FIG. 2 has been used. Such NAND type structured EEPROM, for example, as shown in FIG. 4C, has been produced by using a resistmask having mask lines 6 using the conventional photolithography shown in FIG. 4A and etching between the mask lines to produce spaced charge storage gate lines on an insulating layer 2 coated on the substrate 1, as shown in FIG. 4B. As a result, as shown in FIGS. 4B and 4C, each of the gate lines includes a portion of a charge storage gate layer 3, an insulating layer 4 and a control gate electrode layer 5 shown in FIG. 4A and, as shown in FIG. 4C, source and drain regions are formed in the substrate 1 by impurities implanted between the spaced gate lines.

In the resist process using the conventional photolithography, the transfer of the pattern with the NAND gate structure of line and space is carried out by a condition "line width=space length=minimum rule". When the minimum rule is lessened so as to produce finer lines in a conventional process, resistance of the gate line formed with the minimum width is gradually increased. Thus, as the countermeasure, forming a gate line material with a thick film is effectively carried out. Nevertheless, a large step is produced and the distance between a bit line which is wired on a gate line and a substrate impurity layer becomes large. Therefore, in order to obtain a suitable aspect ratio for a contact, to enlarge the contact in a horizontal direction is needed. Such enlargement of the contact is against the miniaturization. Further, to decrease resistance by increasing the impurity concentration disadvantageously becomes a cause of excess disappearance of data.

SUMMARY OF THE INVENTION

The object of the present invention is to remove the above-mentioned drawbacks or to form an NAND structure with lines and spaces having a width condition of "line>space" without increasing the contact area, i.e., the cell area of a semiconductor device in which memory operation is carried out. Namely, in conventional cells, the line and the space had a relation (line=gate line width)=(space=length of impurity layer). In this invention, the space width is shortened due to increase of the line width so the decreasing of the resistance due to lengthening the gate line width can be realized. Further, in the present invention, to form a thick film of a gate material is not needed because of the lengthening the gate line, with the result that the increase of the step and the increase of the bit line contact can be prevented and the over-erasing of data is also prevented by lowering impurity concentration in the gate line.

In order to attain the above-mentioned objects, the present invention provides a semiconductor device with an NAND structure by using a resist mask for photolithography characterized by providing a mask in which a plurality of lines with a desired width are arranged in parallel with a desired spacing between them, on a control gate provided above an Si wafer; after forming a continuous CVD oxide film on the mask and the control gate, removing a selected thickness of the oxide film by an anisotropic etching so that sidewalls of said oxide film are left on the side faces of the lines; and injecting ions into the Si wafer with self align through spaces formed by the lines with the sidewalls.

Namely, in the present invention, when an NAND type gate is formed by the minimum rule while having the condition: gate length=diffusion layer=minimum line width, a mask to form a gate is formed of a CVD oxide film, a sidewall is formed of an oxide film and a gate is etched by using the films as a mask.

In the present invention, the sidewall which is monolithically formed around the mask has about a quarter circular shape in which the ratio of the straight lines with right angle therebetween, i.e., the vertical and horizontal lines of the shape can be equally formed and the length in the horizontal direction can be controlled by the thickness of mask of the CVD oxide film. In turn, the gate line width becomes longer by the width of a pair of sidewalls (both sides) and the diffusion layer (impurity layer) becomes shorter by the width of the two sidewall portions.

In these semiconductor devices produced by the present invention, the channel length can be lengthened and there is less chance of failure. On the other hand, since the gate line width can be lengthened, even if the gate electrode is thinned, lower resistance can be obtained. Thus, since the aspect ratio becomes small, the process of forming the bit line is easy and the cell area becomes a little small. In turn, since the impurity concentration in the gate wiring can be lowered there is less change for loss of data.

DETAILED DESCRIPTION OF THE PREFERRED EMBODIMENT

The present invention will be explained with reference to drawings below.

Figure 1:
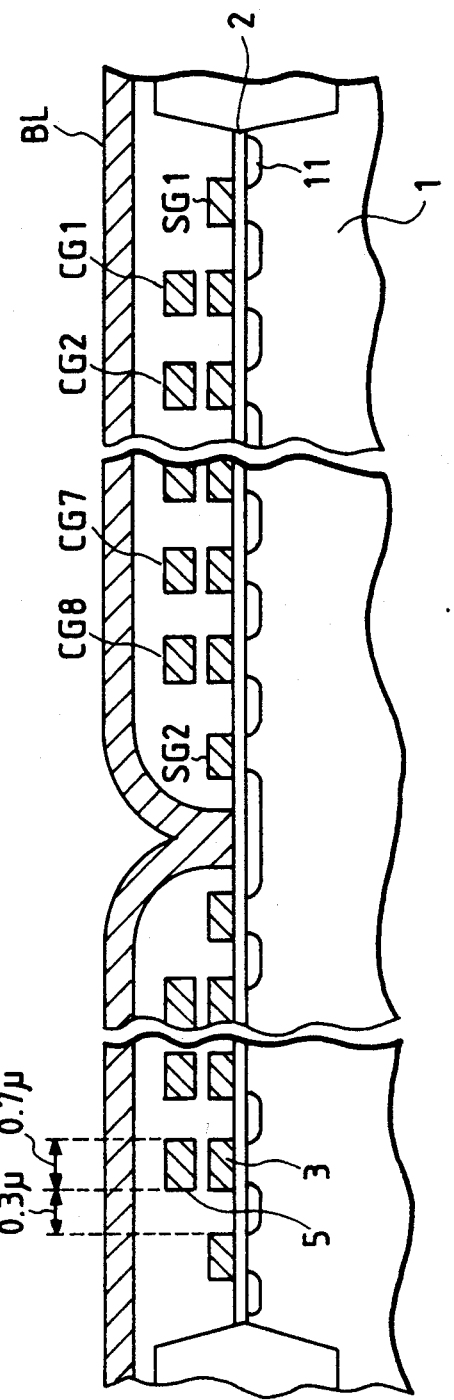
FIG. 1 is a cross sectional view of a semiconductor device manufactured by the present invention.
Figure 2:
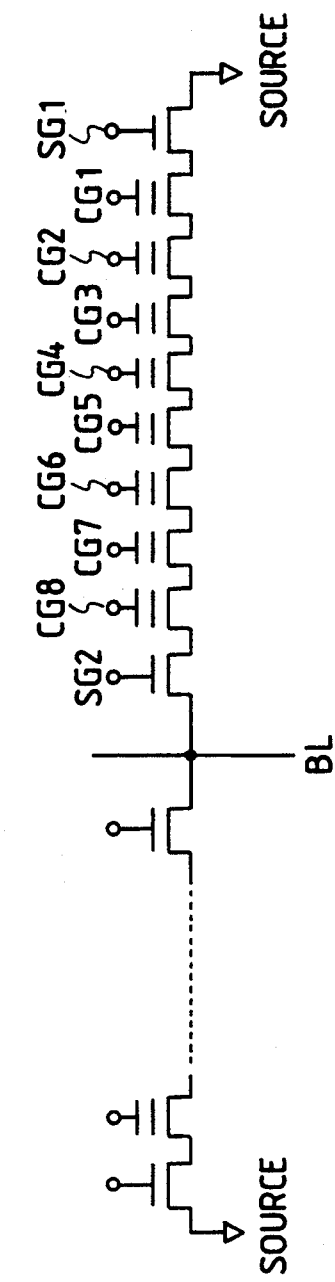
FIG. 2 is a circuit diagram of the semiconductor device shown in FIG. 1.
Figure 3A:
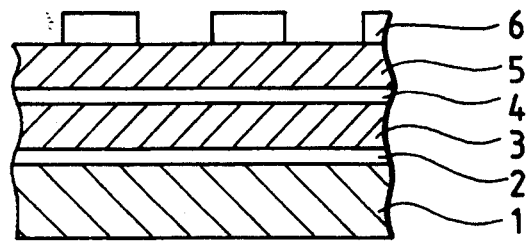
FIGS. 3A–3C show the steps used in a method of manufacturing the semiconductor device of the present invention.
Figure 3B:
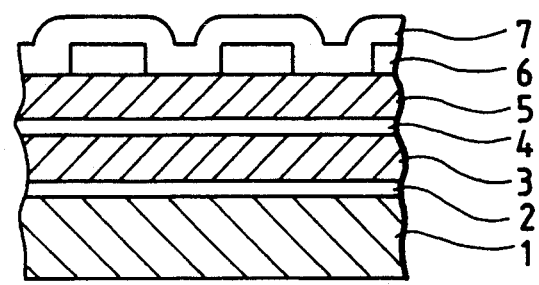
Figure 3C:
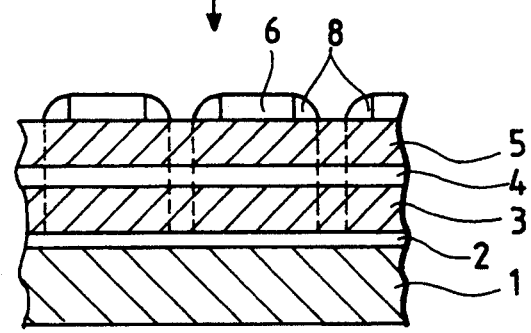

FIGS. 3A–3C show a production process of the NAND type EEPROM of FIG. 1.

In FIG. 3A, 1 denotes Si wafer; 2, tunnelling oxide film; 3, control gate; 4, intervening film; 5, control gate; 6, CVD oxide film mask. The oxide film mask 6 is formed by a pattern transfer using a resist mask.

Next, as shogun in FIG. 3B, after forming the CVD oxide film 7 having a constant thickness on the exposed entire surfaces of the control gate 5 and the oxide film mask 6, a uniform thickness of the oxide film is removed using an anisotropic etching as shown in FIG. 3C so that the sidewall 8 of said oxide film 7 is left at the side edges.

Figure 3D:
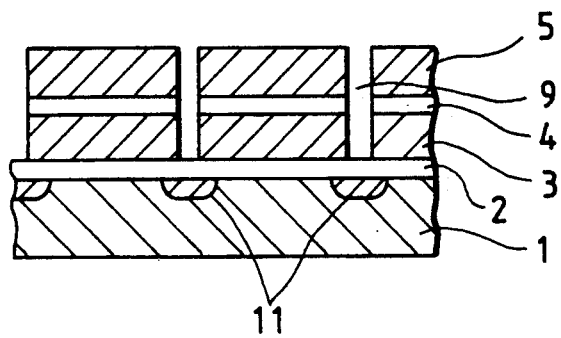
Figure 4A:
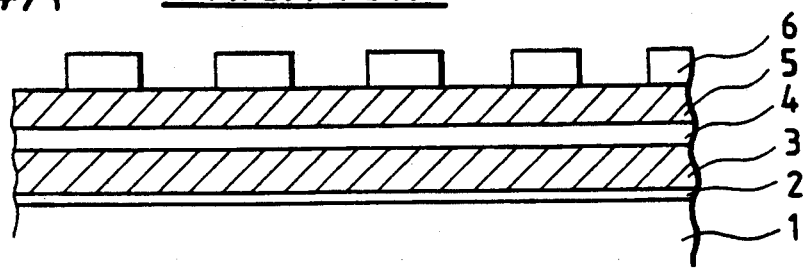
FIGS. 4A–4C show the steps used in a method of manufacturing the conventionally used semiconductor device.
Figure 4A:
Figure 4B:
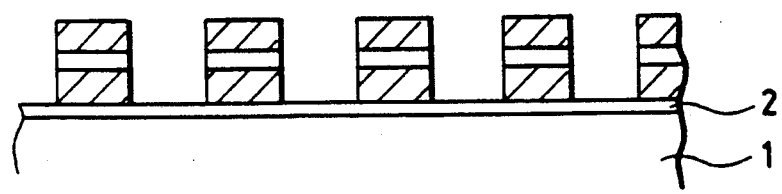
Figure 4B:
Figure 4C:
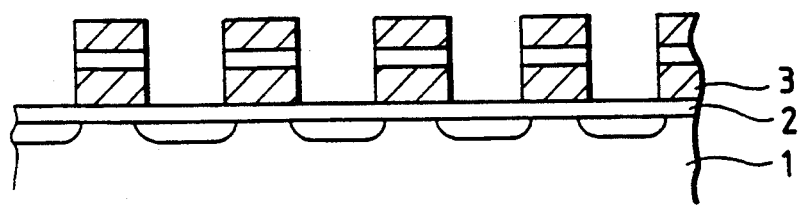

Then, by using the line structured as mentioned above, ion implantation into the Si wafer 1 is carried out with self alignment through spaces 9 between the lines so that diffusion layers 11 are formed as shown in FIG. 3D. Thus, a semiconductor device with an NAND structure can be obtained. The minimum line width of the semiconductor device produced by the present invention is about 0.7μ and the minimum space width is about 0.3μ.

As explained above, in the present invention, the semiconductor device with an NAND structure is produced by providing a mask in which a plurality of lines with a desired width are arranged in parallel with a desired spacing, on a control gate provided above an Si wafer; after forming a continuous CVD oxide film on the mask and the control gate, removing a uniform thickness of the oxide film by an anisotropic etching so that sidewalls of said oxide film are left on the side faces of the lines; and injecting ions into the Si wafer with self align through the spaces between the lines with the sidewalls. In the present semiconductor device, the channel can be lengthened and the chance of failure is reduced. On the other hand, since the gate line width can be increased, low resistance can be obtained even if the gate electrode is thinned. Thus, since the aspect ratio becomes small, the process of forming the bit line is easy and the cell area becomes smaller. In turn, since the impurity concentration in the gate wiring can be lowered, the chance of the loss of data is reduced.

What is claimed is:

1. A method of manufacturing a semiconductor NAND device by using a resist mask for photolithography, comprising the steps of:
    providing a semiconductor substrate coated with a tunneling oxide film and a NAND control gate structure including a first control gate layer, an intervening insulating film and a second control gate layer,
    providing a mask in which a plurality of lines with a desired width are arranged in parallel with intervening spaces on the control gate structure,
    forming a continuous CVD oxide film on the mask lines and on the control gate structure in the intervening spaces between the mask lines,
    removing a selected thickness of the oxide film by an anisotropic etching so that sidewalls of said oxide film are left on the side faces of the mask lines to reduce the width of the intervening spaces,
    etching to remove the portions of the first and second control gate layers and the intervening insulating layer in the spaces between the sidewalls,
    injecting ions into the Si wafer with self align through the intervening spaces between lines with the mask line sidewalls,
    wherein the resulting NAND control gate line width is greater than the width of the intervening spaces, and
    forming a bit line array extending transversely across the NAND control gate lines.

2. A method of manufacturing a semiconductor device as claimed in claim 1, wherein said semiconductor device is one of an FET and a non-volatile memory.

* * * * *